United States Patent
Ahn et al.

(10) Patent No.: US 7,099,072 B2
(45) Date of Patent: Aug. 29, 2006

(54) DIRECT OPTICAL MODULATION TYPE WAVELENGTH CONVERTER

(75) Inventors: Joon Tae Ahn, Daejeon (KR); Jong Moo Lee, Daejeon (KR); Kyong Hon Kim, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 295 days.

(21) Appl. No.: 10/246,104

(22) Filed: Sep. 18, 2002

(65) Prior Publication Data

US 2003/0231382 A1 Dec. 18, 2003

(30) Foreign Application Priority Data

Jun. 12, 2002 (KR) ............... 2002-32843

(51) Int. Cl.
*G02F 1/35* (2006.01)
*H01S 3/00* (2006.01)
(52) U.S. Cl. ...................... 359/332; 359/334
(58) Field of Classification Search ............... 359/344, 359/238, 332
See application file for complete search history.

(56) References Cited

U.S. PATENT DOCUMENTS

| | | | |
|---|---|---|---|
| 5,264,960 A | | 11/1993 | Glance ........................ 359/344 |
| 5,555,121 A | * | 9/1996 | Dupont et al. ............... 398/182 |
| 5,659,558 A | * | 8/1997 | Tohmon et al. ................. 372/5 |
| 5,742,415 A | * | 4/1998 | Manning et al. .............. 398/52 |
| 5,784,183 A | * | 7/1998 | Aoki et al. .................... 398/91 |
| 6,078,417 A | * | 6/2000 | Perino et al. ................ 398/157 |
| 6,118,117 A | * | 9/2000 | Ducellier et al. ..... 250/214 LA |
| 6,208,454 B1 | * | 3/2001 | Koren et al. ................. 359/326 |
| 6,317,252 B1 | * | 11/2001 | Vahala et al. ................ 359/326 |
| 6,366,382 B1 | * | 4/2002 | Morthier et al. ............. 398/178 |
| 6,608,854 B1 | * | 8/2003 | Watanabe ...................... 372/96 |
| 6,646,784 B1 | * | 11/2003 | Leuthold ...................... 359/332 |
| 6,710,911 B1 | * | 3/2004 | LoCascio et al. ............ 359/326 |
| 6,760,520 B1 | * | 7/2004 | Medin et al. .................. 385/43 |
| 2002/0171913 A1 | * | 11/2002 | Batchko et al. .............. 359/333 |
| 2003/0002117 A1 | * | 1/2003 | Naik et al. ................... 359/179 |
| 2003/0123784 A1 | * | 7/2003 | Mukai .......................... 385/15 |

FOREIGN PATENT DOCUMENTS

KR   2001-0077667   8/2001

OTHER PUBLICATIONS

Stephens et al. Low-Input Power Wavelength Conversion at 10 Gb/s Using an Integrated Amplifier/DFB Laser and Subsequen Transmission over 375 km of Fiber. IEEE Photonics Technology Letters, vol. 10, No. 6, Jun. 1998.*

Yasaka et al. Finely Tunable Wavelength Conversion of High Bit-Rate Signals by Using a Superstructure-Grating Distributed Bragg Reflector Laser. Journal of Lightwave Technology. vol. 15. No. 2. Feb. 1997.*

* cited by examiner

*Primary Examiner*—Deandra M. Hughes
(74) *Attorney, Agent, or Firm*—Blakely Sokoloff Taylor & Zafman

(57) ABSTRACT

A direct optical modulation (DOM) type wavelength converter is provided. The provided wavelength converter is a gain-clamped semiconductor optical amplifier (GC-SOA), which does not require a continuous wave (CW) signal, or a semiconductor laser in itself, and reduces a coupling loss between the GC-SOA or the semiconductor laser and an optical fiber while improving an emission threshold of a laser. Therefore, the provided wavelength converter converts a wavelength of an input signal beam having a low intensity by controlling the intensity of the input signal.

16 Claims, 6 Drawing Sheets

DIRECT OPTICAL MODULATION TYPE WAVELENGTH CONVERTER

BACKGROUND OF THE INVENTION

1. Field of the Invention

The present invention relates to a wavelength converter for converting the wavelength of input signal beams into different wavelength, and more particularly, to a direct optical modulation (DOM) type wavelength converter for directly converting the wavelength of optical signals without a process of converting the optical signals into electrical signals.

2. Description of the Related Art

Wavelength converters are essential functional devices in constituting a wavelength division multiplexing (WDM) optical network to efficiently utilize the network. Wavelength converters are obtained by using various methods; among these, a method of using cross gain modulation (XGM) and cross phase modulation (XPM) of a semiconductor optical amplifier (SOA) is considered to have the highest possibility of realization, because the method has advantages such as simplicity and high conversion efficiency.

FIG. 1 illustrates a wavelength converter by an XGM method. In this case, an input data signal having a wavelength λ1 and a continuous wave (CW) laser input signal beam having a wavelength λ2, which is the wavelength to be converted, are incident into an SOA 20. The intensity of the CW laser input signal is modulated by the input data signal and a converted signal having a wavelength λ2 is output. Here, the converted signal is output as an inverted data signal of the input data signal. In addition, an XPM type wavelength converter utilizes an SOA circuit in which SOAs are integrated in both sides of a Mach-Zender interferometer.

A wavelength converter using semiconductor lasers converts the wavelength of an input signal beam into the wavelength of a laser emission signal beam by using a DOM technique which generates or eliminates a laser emission according to the intensity of the input signal beam. Such a wavelength converter performs as the wavelength converter described with reference to FIG. 1 while having a simple structure as shown in FIG. 2. Here, the wavelength converter of FIG. 2 outputs a converted signal having a wavelength λ2 according to only an input data signal having a wavelength λ1 to a laser diode (LD) 40.

Although such a wavelength converter using semiconductor lasers has the advantages of a simple structure and a high conversion efficiency, the wavelength converter requires an input signal beam having high intensity. More specifically, most of the laser wavelength converters require an input signal beam having an intensity of about 0 to 10 dBm. Even though structures for integrating an SOA at an input of an LD in order to lower the required intensity of an input signal beam have been presented; however, laser wavelength converters still require an input signal beam of over −4 dBm.

SUMMARY OF THE INVENTION

To solve the above-described problems, it is an objective of the present invention to provide a wavelength converter which converts the wavelength of an input signal beam having a low intensity, for example, less than −4 dBm.

To accomplish the above objective of the present invention, a direct optical modulation (DOM) type wavelength converter uses a semiconductor laser and an optical fiber, wherein the laser having a high threshold of laser emission is used to convert a wavelength of an input signal beam having a low intensity of less than −4 dBm, and an optical coupling enhancement member is installed between the laser and the optical fiber to improve a coupling efficiency between the laser and the optical fiber.

It is preferable that the optical coupling enhancement member is a spot size converter or a lensed fiber.

It is preferable that the laser is a laser to which a Fabri-Perot resonator is applied or a distributed Bragg reflector (DBR) laser, and a loss portion for applying a loss to the laser is included in an opposite side of the input side of the input signal beam to increase the threshold of the laser emission.

It is possible that the laser is a distributed feedback (DFB) laser, and the coupling strength of gratings is lowered to increase the threshold of the laser emission.

Here, the laser can be a wavelength variable laser for adjusting an emission wavelength to vary a converted output wavelength.

To accomplish the above objective of the present invention, a DOM type wavelength converter according to the present invention uses a gain clamping emission wavelength of a gain-clamped semiconductor optical amplifier (GC-SOA) as the wavelength of an output beam. Here, it is preferable that the GC-SOA is a GC-SOA for varying a gain clamping emission wavelength to vary a converted output wavelength.

To accomplish the above objective of the present invention, A DOM type wavelength converter according to the present invention uses an SOA, which does not emit itself, as a gain medium and constituting a ring type laser resonator outside of the SOA so as to use the emission wavelength of a laser as the wavelength of an output beam. Here, a wavelength variable optical filter can be included in the resonator for adjusting an emission wavelength to vary a converted output wavelength. In addition, an attenuator can be included in the resonator to increase the emission threshold of the resonator.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Figure 1:
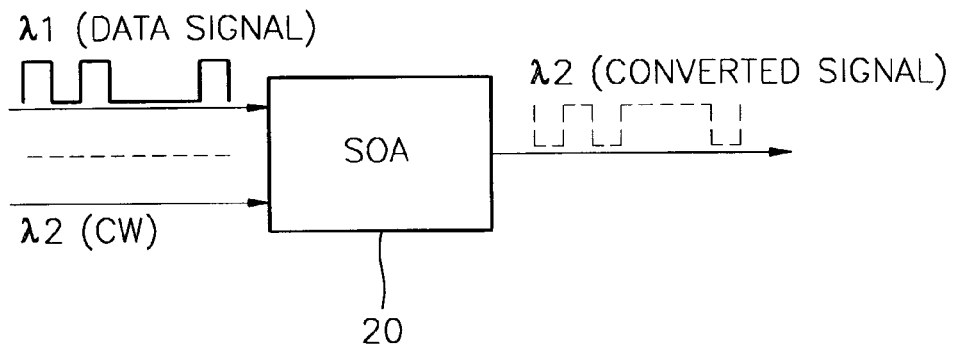
FIG. 1 is a conventional wavelength converter utilizing a semiconductor optical amplifier (SOA)
Figure 2:
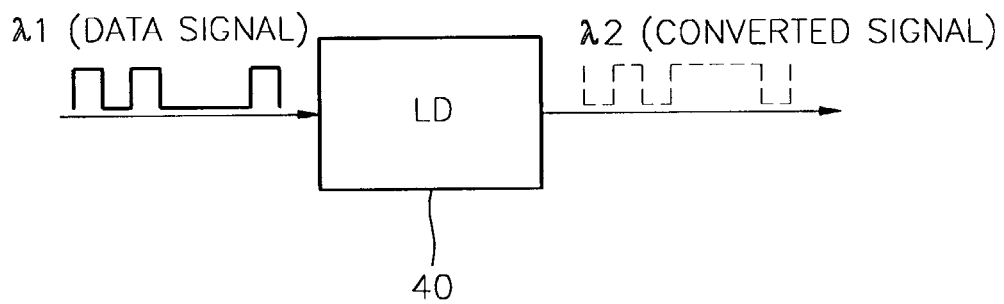
FIG. 2 is another conventional wavelength converter utilizing a direct optical modulation (DOM) of a semiconductor laser.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

The operation principle of a laser wavelength converter using a direct optical modulation (DOM) will now be briefly described for a better understanding of the present invention. When a beam is input from outside to a laser wavelength converter during a laser emission, an emission wavelength and the external input signal beam share a gain so that the intensity of the emission wavelength varies according to the intensity of the input signal beam. When the intensity of the external input signal beam is low, the intensity of the emission wavelength is high, and when the intensity of the external input signal beam is high, the intensity of the emission wavelength is low. Accordingly, a laser emission efficiency increases in the absence of the external input signal beam; however, when the intensity of an external input signal beam is high, a laser emission is impossible, thereby converting the wavelength of the input signal beam into the wavelength of an output beam. Here, in the case that the laser emission is properly reduced by an input signal beam having a low intensity, a wavelength conversion can be conveniently performed.

Two conditions for lowering the intensity of an input signal beam into a DOM type laser wavelength converter are provided in the present invention.

First, a coupling loss between a laser diode (LD) and an optical fiber is reduced to smoothly input an input signal beam into the LD. When signal beams are input into optical fibers connected to an LD, a signal loss proportional to the coupling loss between the optical fiber and the LD appears. Accordingly, a wavelength conversion is induced by the input signal beam having a low intensity when the coupling loss between the optical fiber and the LD is small. In order to improve a coupling efficiency between an optical fiber and an LD, a method for attaching spot size converters (SSCs) or lensed fiber to the ends of the LD is provided in the present invention. Since conventional laser wavelength converters do not use SSCs or lensed fiber, the conventional laser wavelength converters can convert only the wavelengths of input signal beams having a high intensity.

Second, a threshold of a laser emission is increased, because a high threshold of a laser emission may easily stop the laser emission. Since a laser threshold is low in the conventional laser wavelength converters, the conventional laser wavelength converters can convert only the wavelengths of input signal beams having a high intensity. As well known to those skilled in the art, only technologies for lowering the threshold of a laser emission have been researched in laser application field. A novel utility of the high threshold of the laser emission, which has been considered useless, is disclosed in the present invention.

Under the above two conditions, a DOM type wavelength converter, which obtains an output signal having a converted wavelength by an input signal having a low optical intensity, can be realized. According to the present invention, a wavelength conversion takes place even when a signal having an optical intensity of less than −4 dBm is input.

A gain-clamped semiconductor optical amplifier (GC-SOA) is an example satisfying the above conditions. A GC-SOA is an optical amplifier for applying a constant gain to an input signal regardless of the intensity of an input signal beam by occurring a laser emission for a wavelength not used in the amplification of the input signal and maintaining a density inversion in a medium. Here, if the threshold of a laser emission for a gain-clamped wavelength is excessively low, i.e., a laser emission is excellent, a gain applied to the input signal beam becomes excessively small. Accordingly, the threshold of the laser emission has to maintain a predetermined level. In addition, SSCs are attached to the ends of the amplifier to improve gain characteristic of the amplifier. Consequently, when a DOM type wavelength converter is formed by using the GC-SOA having the SSCs, the DOM type wavelength converter may convert the wavelength of an input signal beam having a low intensity. Even though an emission wavelength of a GC-SOA itself has been considered useless or to be secondary, the emission wavelength of the GC-SOA becomes essential in the wavelength converter according to the present invention. In other words, a novel utility of the emission wavelength of the GC-SOA is disclosed in the present invention.

FIRST EMBODIMENT

Figure 3A:
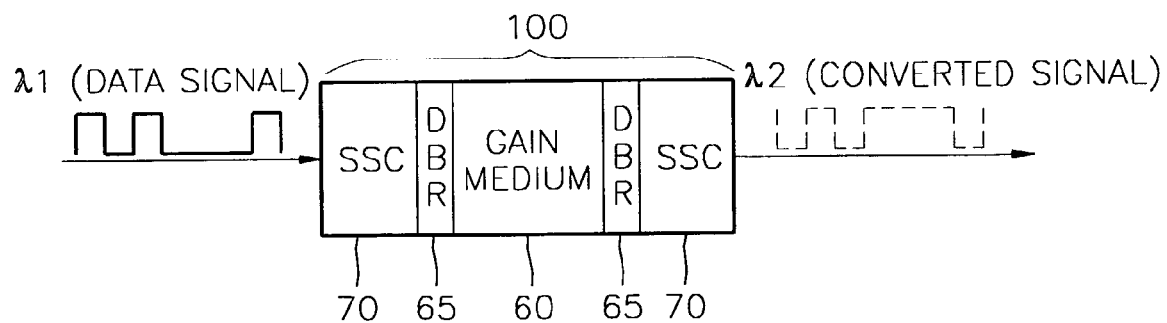
FIG. 3A is a DOM type wavelength converter utilizing a gain-clamped semiconductor optical amplifier (GC-SOA) according to a first embodiment of the present invention.

FIG. 3A is a wavelength converter utilizing a GC-SOA 100 according to a first embodiment of the present invention. Referring to FIG. 3A, SSCs 70 are coupled to ends of a gain medium 60 to improve a coupling efficiency of an input signal beam and an output beam. In other words, an optical signal loss by the reflection and coupling of optical signals is minimized. In addition, distributed Bragg reflectors (DBRs) 65 are installed between the gain medium 60 and the SSCs 70 so that a beam having a wavelength corresponding to a Bragg wavelength, i.e., $\lambda_2$, is emitted to apply a constant gain to the input signal beam regardless of the size of the input signal beam. In the preferred embodiment, the wavelength $\lambda_1$ of the input signal beam is converted into such a Bragg wavelength $\lambda_2$. Accordingly, the converted wavelength is determined by the Bragg wavelength.

Meanwhile, if wavelength variable type DBRs are attached to the ends of the gain medium 60, an emission wavelength is adjusted so that a wavelength variable wavelength converter is attained. In addition, lensed fiber can be attached to the ends of the gain medium 60 instead of the SSCs 70.

SECOND EMBODIMENT

Figure 3B:
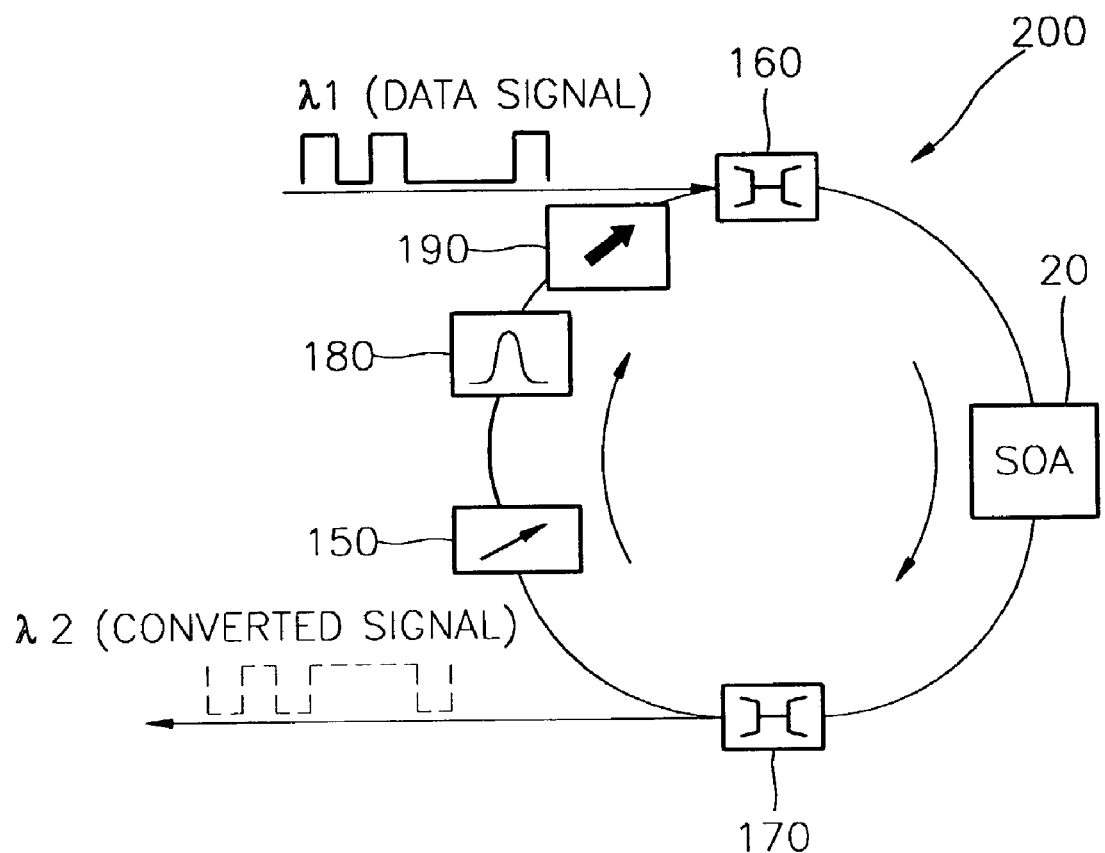
FIG. 3B is a DOM type wavelength converter utilizing a GC-SOA according to a second embodiment of the present invention.

FIG. 3B is a wavelength converter utilizing a GC-SOA 200 according to a second embodiment of the present invention. Referring to FIG. 3B, a conventional SOA 20, which cannot clamp a gain by itself, is used as a gain medium and a laser resonator as a ring type resonator is constituted outside so as to obtain a GC-SOA 200 as a wavelength converter. In this case, since various optical devices can be easily installed on the laser resonator at outside, functions of the laser wavelength converter may vary. As shown in FIG. 3B, when an attenuator 150 is installed in the laser resonator, an emission threshold can freely increase. In addition, if a wavelength variable optical filter 180 is arranged, an emission wavelength varies so that a wavelength variable type laser wavelength converter is obtained. Here, the attenuator 150 may be installed ahead of or behind the wavelength variable optical filter 180. The wavelength converter according to the second embodiment of the present invention further includes optical fiber couplers 160 and 170 and an optical isolator 190.

THIRT EMBODIMENT

Figure 4A:
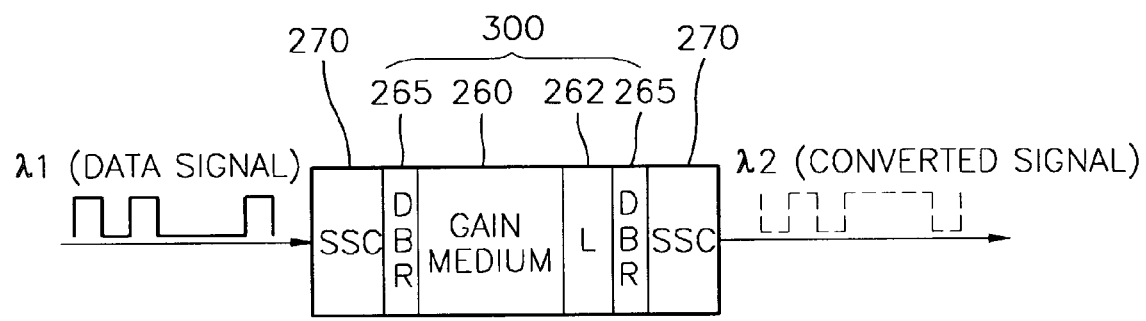
FIG. 4A is a DOM type wavelength converter utilizing a semiconductor laser according to a third embodiment of the present invention.

FIG. 4A illustrates a DOM type wavelength converter utilizing a semiconductor laser 300 according to a third embodiment of the present invention. Referring to FIG. 4A, differently from a conventional semiconductor laser having one terminal, terminals are arranged at both ends of a laser 300 to separate an input and an output. In addition, SSCs 270 are installed at the input and output of the laser 300 to improve coupling efficiency of a beam. DBRs 265 are installed between a gain medium 260 and the SSCs 270 to emit the beam having a Bragg wavelength $\lambda 2$. Moreover, a loss portion (L) 262 for adjusting an optical loss is installed at an opposite portion to the input to cause an optical loss in an emission wavelength and not in the input beam so as to increase the threshold of a laser emission. By adjusting the optical loss, the intensity of an input signal beam whose wavelength is converted, may be controlled.

Meanwhile, if wavelength variable type DBRs are attached to the ends of the gain medium 260, an emission wavelength is adjusted so that a wavelength variable type laser wavelength converter is attained.

In the present embodiment, the loss portion 262 is installed in an opposite side to the input to improve the threshold of the laser emission. However, the threshold of the laser emission can be increased by applying a scheme for lowering a Q-value of a resonator. For example, in case that a laser or a DBR laser to which a Fabri-Perot resonator is used as a laser 300, the threshold of the laser emission can be increased by lowering the reflectivity of a laser reflection mirror.

FOURTH EMBODIMENT

Figure 4B:
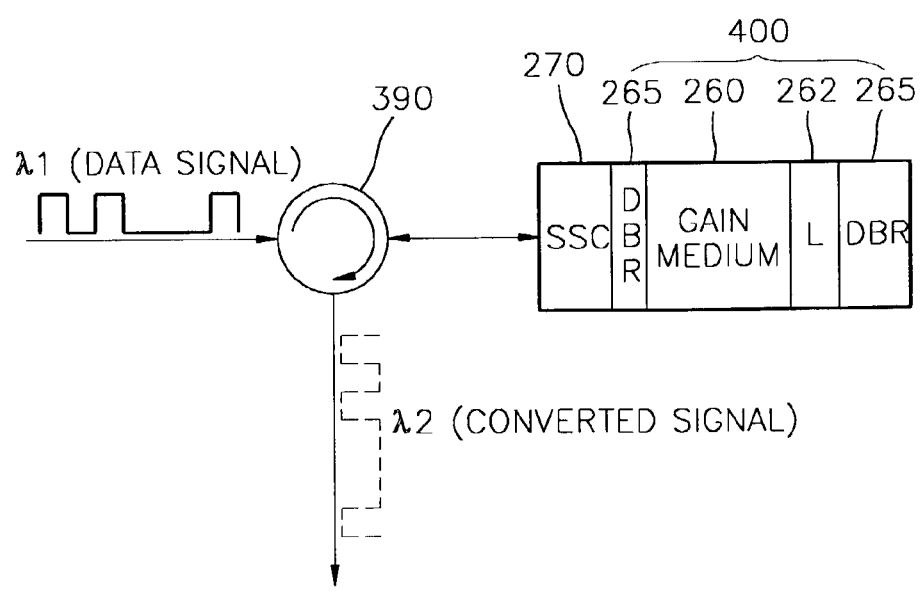
FIG. 4B is a DOM type wavelength converter utilizing a semiconductor laser according to a fourth embodiment of the present invention.

FIG. 4B illustrates a DOM type wavelength converter utilizing a semiconductor laser 400 according to a fourth embodiment of the present invention. Referring to FIG. 4B, an optical circulator 390 is applied to a laser 400 having only one terminal to separate an input signal beam and an output beam. Here, the same reference numerals denote the same elements as shown in FIG. 4A and the descriptions thereof will be omitted.

A laser having a Fabri-Perot resonator is illustrated in FIGS. 4A and 4B. A Fabri-Perot laser has emission modes for a plurality of wavelengths; however, when an external beam having the same wavelength as the wavelength of a laser emission is input, the emission modes for the wavelength not corresponding to the external beam are restrained to output the same wavelength as that of the laser emission. A Fabri-Perot laser manufactured by cleaving a cleavaged facet of a semiconductor material in parallel is one of the simplest resonators. The cleaved cleavaged facet operates as a reflection mirror having a constant reflectivity by a difference in refractive indexes of the semiconductor material and air. Here, in the case of using GaAs/AlGaAs, the reflectivity of about 30% is attained. Moreover, in order to control output or efficiency, the semiconductor material may be high reflective (HR) or anti-reflective (AR) coated.

A DFB laser has gratings in vertical to the resonance direction of a beam and resonates by the distribution and refraction of the gratings. Here, a DFB laser may emit in a single longitudinal mode while used as an optical communication optical source. In the case of applying such a DFB laser, the threshold of a laser emission can be increased by reducing a coupling force of the gratings that decide an emission wavelength. Accordingly, in order to realize a wavelength converter to which the DFB laser is applied, a grating coupling constant has to be lowered and SSCs have to be installed at both ends of the laser. In this case, the wavelength converter according to the present invention uses the characteristic of the DFB laser, i.e., when a signal having a wavelength different from the wavelength of the DFB laser is input while the DFB laser is emitted, the emission state of the DFB laser is changed. Here, the DFB laser is not emitted by an input laser signal, which is comparable to the output of the DFB laser; however, the DFB laser is emitted in the absence of a laser signal having a different wavelength or by a weak input laser signal, to output the DFB laser in the opposite type of the input laser signal. Gratings provide a reflectivity for one wavelength related to a grating period.

The DBR laser is similar to a DFB laser, but uses a DBR as a reflection mirror. In addition, the DBR laser attained by expanding the concept of the DFB laser has separate gratings and a laser optical gain region separated from the gratings. Here, the gratings perform as separate reflection mirrors. The DBR laser is similar to a Fabri-Perot laser, conceptionally, where the gratings substitute for cleaved reflection mirrors.

Figure 5:
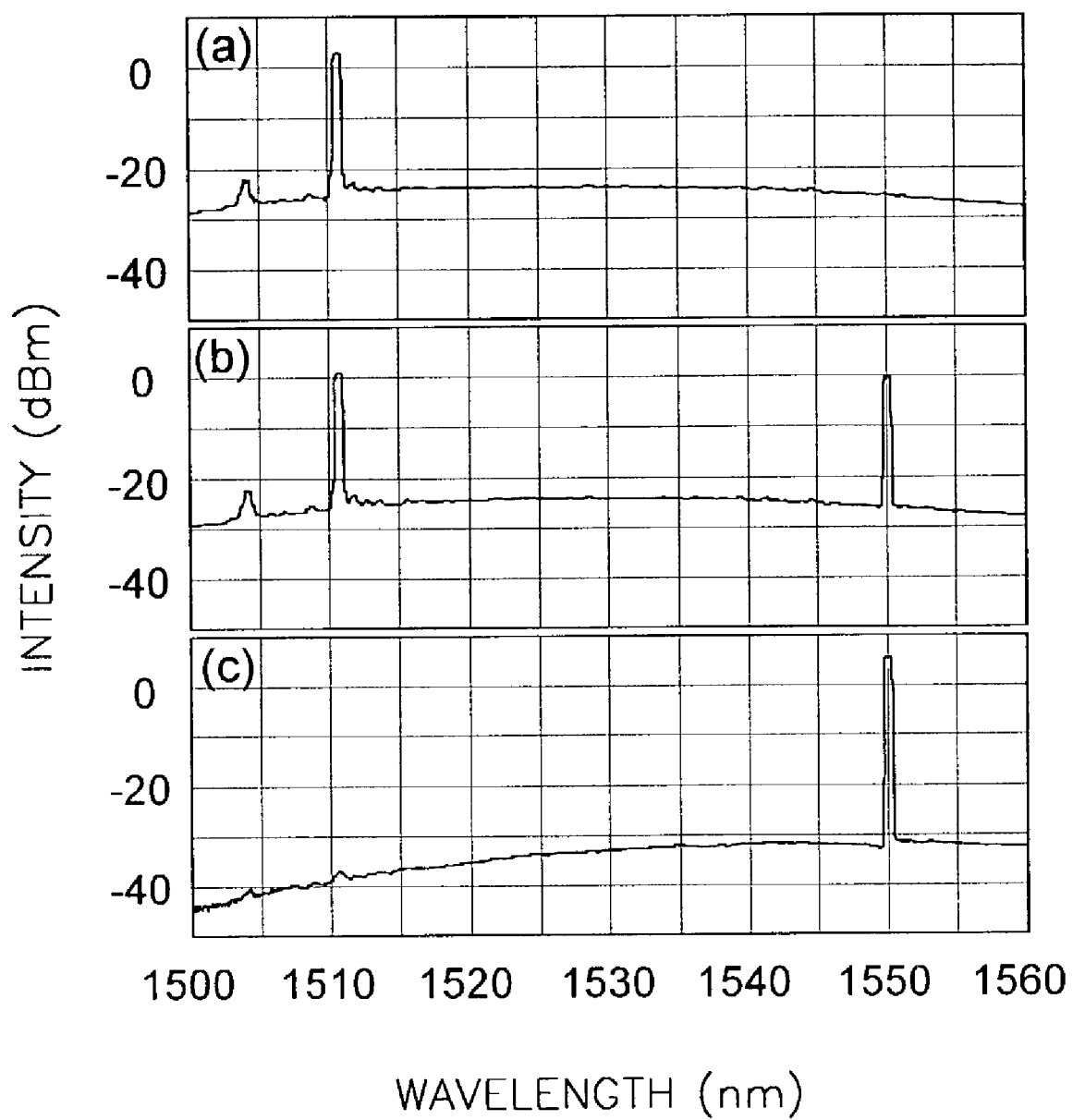
FIG. 5 illustrates spectrums output from the wavelength converter of FIG. 3A according to the intensities of an input signal beam.
Figure 6:
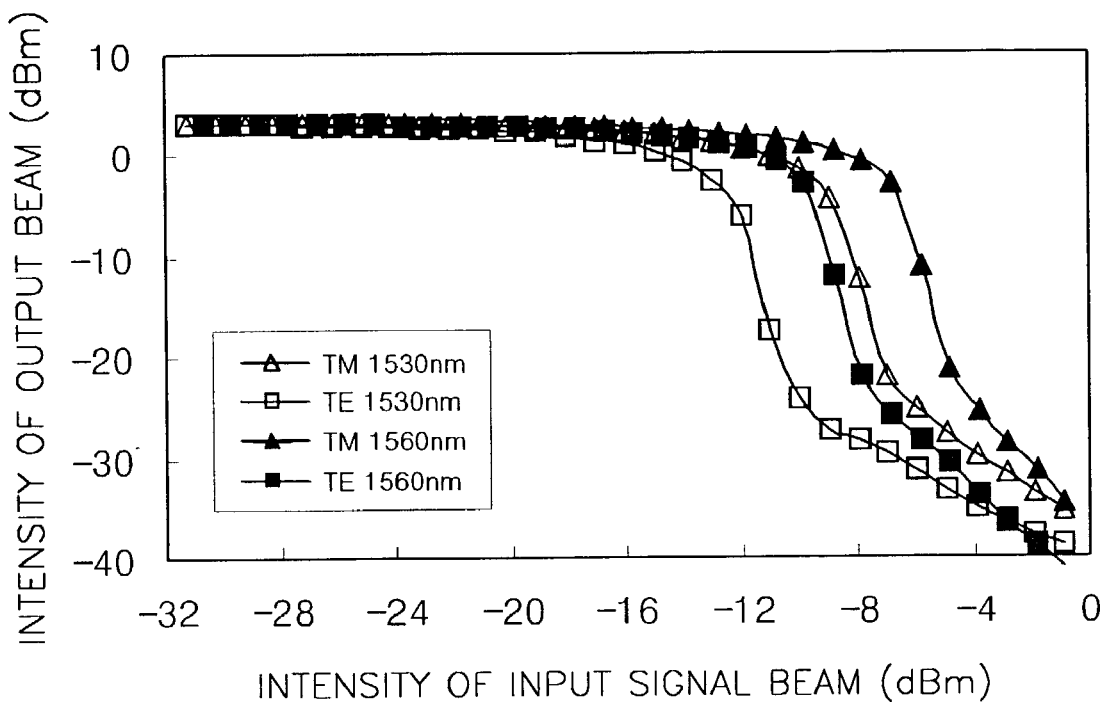
FIG. 6 is a graph illustrating intensity variations of beams output from the wavelength converter of FIG. 3A according to the intensities of input signal beams for different wavelengths.

FIGS. 5 through 7 are results of experiments in which a wavelength converter of FIG. 3A is used.

FIG. 5 illustrates spectrums output from a wavelength converter of FIG. 3A according to the intensities of input signal beams. Referring to FIG. 5, changes in an output spectrum according to the intensities of an input signal are illustrated while a signal having a wavelength of 1550 nm is incident to a GC-SOA 100 of FIG. 3A. In FIG. 5, an output spectrum (a) illustrates a case where an input signal is absent. Here, a gain clamping emission signal having a wavelength of 1510.6 nm exists. An output spectrum (b) illustrates a case where the intensity of an input signal is −14 dBm. Here, the intensity of an emission wavelength signal is slightly reduced. An output spectrum (c) illustrates a case where the intensity of an input signal is −4 dBm. Here, a laser emission does not occur. As a result, the wavelength of an input signal is converted from 1550 nm to 1510.6 nm.

FIG. 6 illustrates variations of intensities of beams output from a wavelength converter of FIG. 3A according to the intensities of input signal beams for different wavelengths. In this case, the intensity of a continuous wave (CW) type input signal beam varies to measure the intensity of a laser emission wavelength. Although the intensity of the laser emission wavelength is substantially measured at various intensities of an input signal beam, such as 1530, 1540, 1550, and 1560 nm, the results for only the intensities of 1530 and 1560 nm are illustrated in FIG. 6. In this case, the gain of a GC-SOA 100 varies according to the polarized beam of the input signal beam so that measurement results of a transverse electric (TE) mode and a transverse magnetic (TM) mode for the same wavelength signal becomes different. Transparent triangles of FIG. 6 denote the result of a TM mode for the input signal of 1530 nm and transparent squares denote the result of a TE mode for the input signal of 1530 nm. Colored triangles of FIG. 6 denote the result of a TM mode for the input signal of 1560 nm and colored squares denote the result of a TE mode for the input signal of 1560 nm. According to the measurement results, a wavelength conversion is likely to occur in the absence of a laser emission by the input signal beam having the intensity of about −10 to −4 dBm.

Figure 7A:
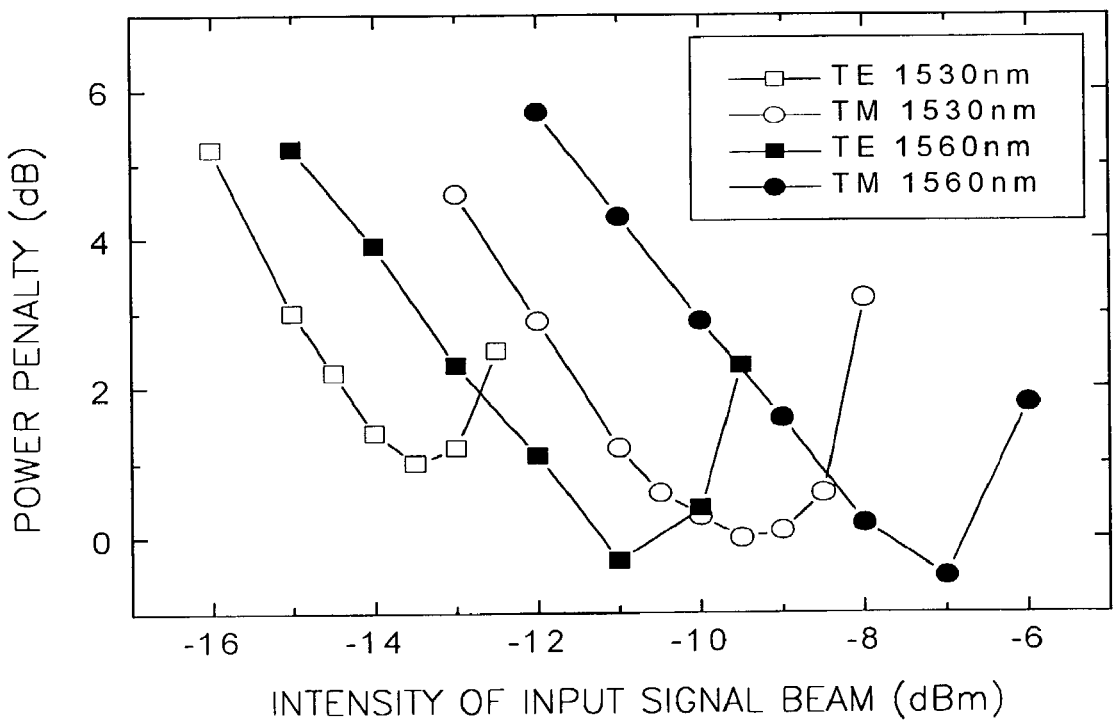
FIGS. 7A and 7B illustrate power penalty and bit error rate of the wavelength converter of FIG. 3A according to an input signal of 2.5 Gb/s.
Figure 7B:
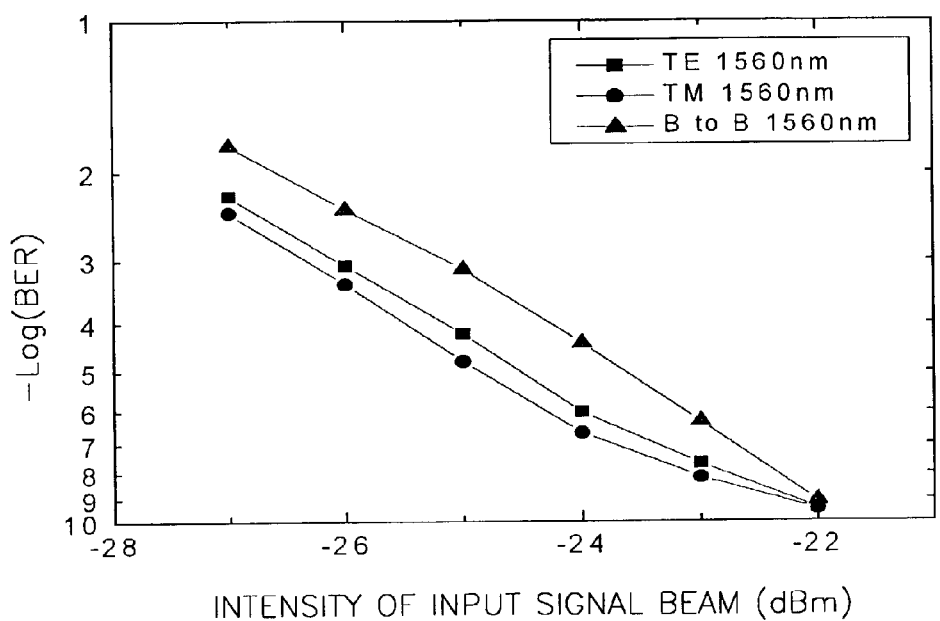

FIGS. 7A and 7B respectively illustrate power penalty and bit error rate (BER) of a wavelength converter of FIG. 3A according to an input signal of 2.5 Gb/s. Here, an input signal of 2.5 Gb/s modulated into a nonreturn to zero (NRZ) type in which the length of pseudorandom binary sequences (PRBS) is $2^{31}-1$, is used.

In FIG. 7A, transparent squares denote the measurement result of a TE mode for the input signal of 1530 nm and transparent circles denote the measurement result of a TE mode for the input signal of 1530 nm. Colored squares denote the measurement result of a TM mode for the input signal of 1560 nm and colored circles denote the measurement result of a TM mode for the input signal of 1560 nm.

In FIG. 7A, wavelength conversion efficiencies are the highest at the intensities of an input signal beam where output penalties are the smallest. Here, the output penalty is the smallest when the input signal beam has the intensity of about −13.5 to −7 dBm. The average intensity of a signal modulated into an NRZ PRBS type is less than the intensity of a CW type signal by 3 dBm. Thus, the intensities of the input signal beam having the smallest output penalties correspond to the intensities of an input signal beam having an excellent wavelength conversion of FIG. 6, which are about −10 to −4 dBm. Accordingly, a wavelength converter according to the present invention is improved than a conventional wavelength converter, which requires an input signal beam of over −4 dBm.

FIG. 7B illustrates −log values of BERs for an input signal of 1560 nm. Here, both a TE mode represented by squares and a TM mode represented by circles have negative power penalty values. In FIG. 7B, B to B represented by triangles stands for back-to-back and denotes a signal input into the input of a wavelength converter.

According to the present invention, a wavelength of an input signal having a low intensity, such as less than −4 dBm, can be converted. Thus, an optical amplifier is not required in the input of a wavelength converter, thereby simplifying the design and constitution of a wavelength division multiplexing (WDM) optical network. In addition, the wavelength converter can be easily applied to other fields while used economically and efficiently.

A wavelength converter according to the present invention is not a complicate integrated device, but a GC-SOA or a DFB/DBR laser in itself without requiring a CW signal. In addition, a wavelength converter according to the present invention reduces a coupling loss between a GC-SOA or a DFB/DBR laser and an optical fiber and increases the threshold of a laser emission. As a result, a wavelength converter according to the present invention requires a reduced manufacturing cost due to omitting a CW light source, and converts a wavelength of a signal having a low intensity while being formed in a simple structure due to not integrating an SOA in an input of a laser.

While this invention has been particularly shown and described with reference to preferred embodiments thereof, the preferred embodiments described above are merely illustrative and are not intended to limit the scope of the invention. It will be understood by those skilled in the art that various changes in form and details may be made therein without departing from the spirit and scope of the invention as defined by the appended claims.

What is claimed is:

1. A direct optical modulation (DOM) type wavelength converter including a gain-clamped semiconductor optical amplifier (GC-SOA), the DOM type wavelength converter using a semiconductor laser and an optical fiber, wherein
   the laser has a laser emission threshold capable of producing a wavelength conversion of an input signal beam having a low intensity of less than −4 dBm, the wavelength conversion results from on/off oscillation of the semiconductor laser, and
   an optical coupling enhancement member is installed between the laser and the optical fiber to improve a coupling efficiency between the laser and the optical fiber,
   and the GC-SOA generates a variable gain clamping emission wavelength that is used as the wavelength of an output beam.

2. The DOM type wavelength converter of claim 1, wherein
   the laser is a laser to which a Fabri-Perot resonator is applied or a distributed Bragg reflector (DBR) laser, and
   a loss portion for applying a loss to the laser is included in an opposite side of the input side of the input signal beam to increase the threshold of the laser emission.

3. The DOM type wavelength converter of claim 1, wherein
   the semiconductor laser is a laser to which a Fabri-Perot resonator is applied or a distributed Bragg reflector (DBR) laser, and
   a reflectivity is lowered to increase the threshold of the laser emission.

4. The DOM type wavelength converter of claim 1, wherein
   the laser is a distributed feedback (DFB) laser, and
   the coupling strength of gratings is lowered to increase the threshold of the laser emission.

5. The DOM type wavelength converter of claim 1, wherein the optical coupling enhancement member is a spot size converter or a lensed fiber.

6. The DOM type wavelength converter of claim 2, wherein the laser is a wavelength variable laser for adjusting an emission wavelength so as to vary a converted output wavelength.

7. The DOM type wavelength converter of claim 3, wherein the laser operates to vary a converted output wavelength.

8. The DOM type wavelength converter of claim 4, wherein the laser operates to vary a converted output wavelength.

9. The DOM type wavelength converter of claim 5, wherein the laser operates to vary a converted output wavelength.

10. The DOM type wavelength converter of claim 1, wherein the GC-SOA operates to vary a converted output wavelength.

11. An apparatus comprising:
    direct optical modulation (DOM) type wavelength converter using a semiconductor laser and an optical fiber, the semiconductor laser has a laser emission threshold capable of producing a wavelength conversion of an input signal beam having a low intensity of less than −4 dBm, and the wavelength conversion results from on/off oscillation of the semiconductor laser,
    an optical coupling enhancement member, the optical coupling enhancement member disposed between the laser and the optical fiber to improve a coupling efficiency between the laser and the optical fiber, and a gain-clamped semiconductor optical amplifier (GC-SOA) to vary a gain clamping emission wavelength and to vary a converted output wavelength.

12. The apparatus of claim 11, wherein the semiconductor laser is one of a semiconductor laser to which a Fabri-Perot resonator is applied, and a distributed Bragg reflector (DBR) laser, and a loss portion for applying a loss to the laser is included in an opposite side of the input side of the input signal beam to increase the threshold of the laser emission.

13. The apparatus of claim 11, wherein the semiconductor laser is one of a semiconductor laser to which a Fabri-Perot resonator is applied, and a distributed Bragg reflector (DBR) laser, and a reflectivity is lowered to increase the threshold of the laser emission.

14. The apparatus of claim 11, wherein the laser is a distributed feedback (DFB) laser, and the coupling strength of gratings is lowered to increase the threshold of the laser emission.

15. The apparatus of claim 11, wherein the optical coupling enhancement member is one of a spot size converter and a lensed fiber.

16. The apparatus of claim 11, wherein a gain clamping emission wavelength of the GC-SOA is used as the wavelength of an output beam.

* * * * *